(12) United States Patent
Yang et al.

(10) Patent No.: US 9,946,136 B2
(45) Date of Patent: Apr. 17, 2018

(54) DISPLAY APPARATUS AND MANUFACTURING METHOD THEREOF

(71) Applicants: Boe Technology Group Co., Ltd., Beijing (CN); Beijing Boe Optoelectronics Technology Co., Ltd., Beijing (CN)

(72) Inventors: Ming Yang, Beijing (CN); Wenqing Zhao, Beijing (CN); Xue Dong, Beijing (CN); Renwei Guo, Beijing (CN); Dong Yang, Beijing (CN)

(73) Assignees: BOE TECHNOLOGY GROUP CO., LTD., Beijing (CN); BEIJING BOE OPTOELECTRONICS CO., LTD., Beijing (CN)

( * ) Notice: Subject to any disclaimer, the term of this patent is extended or adjusted under 35 U.S.C. 154(b) by 60 days.

(21) Appl. No.: 14/906,503

(22) PCT Filed: Jul. 16, 2015

(86) PCT No.: PCT/CN2015/084238
§ 371 (c)(1),
(2) Date: Jan. 20, 2016

(87) PCT Pub. No.: WO2016/123911
PCT Pub. Date: Aug. 11, 2016

(65) Prior Publication Data
US 2016/0370683 A1 Dec. 22, 2016

(30) Foreign Application Priority Data
Feb. 6, 2015 (CN) .......................... 2015 1 0064932

(51) Int. Cl.
*G02F 1/163* (2006.01)
*G02F 1/153* (2006.01)
(Continued)

(52) U.S. Cl.
CPC .......... *G02F 1/1533* (2013.01); *G02F 1/1343* (2013.01); *G02F 1/1345* (2013.01);
(Continued)

(58) Field of Classification Search
CPC ................................ G02F 1/1533; G02F 1/29
See application file for complete search history.

(56) References Cited

U.S. PATENT DOCUMENTS 5,074,648 A * 12/1991 Warszawski .......... G02F 1/1508
359/265
9,797,567 B2 * 10/2017 Kastner-Jung .......... F21S 10/02
(Continued)

FOREIGN PATENT DOCUMENTS

| CN | 102695364 | 9/2012 | |
|---|---|---|---|
| CN | 103116233 | * 5/2013 | ............. G02B 27/26 |

(Continued)

OTHER PUBLICATIONS

Office Action from China Application No. 201510064932.7 dated Mar. 7, 2017.
(Continued)

*Primary Examiner* — Sang V Nguyen
(74) *Attorney, Agent, or Firm* — Calfee, Halter & Griswold LLP (57) ABSTRACT

The present invention discloses a display apparatus and a manufacturing method thereof. The display apparatus comprises a display device, an out-cell device and a flexible printed circuit board for being connected to an external signal. The display device has a first category of leads and a second category of leads; the out-cell device has reserved leads, and the reserved leads are electrically connected to the second category of leads; and the flexible printed circuit board has a first category of pins and a second category of pins, the first category of leads are electrically connected to
(Continued)

the first category of pins, and the second category of leads are electrically connected to the second category of pins. In this way, the reserved leads are electrically connected to the second category of leads, while the second category of leads are electrically connected to the second category of pins, thereby enabling conduction between the out-cell device and the external signal. As compared with the prior art in which the out-cell device and the display device are provided with their respective flexible printed circuit boards, the display apparatus as provided in the embodiments of the present invention omits the step of separately making a flexible printed circuit board of the out-cell device, thereby reducing the cost of production of the display apparatus and at the same time further simplifying the structure of the out-cell device of the display apparatus.

17 Claims, 4 Drawing Sheets

(51) Int. Cl.
| | | |
|---|---|---|
| *G02F 1/1343* | (2006.01) | |
| *G02F 1/1345* | (2006.01) | |
| *G06F 3/041* | (2006.01) | |
| *G02F 1/155* | (2006.01) | |
| *G02F 1/29* | (2006.01) | |
| *G02B 27/22* | (2018.01) | |

(52) U.S. Cl.
CPC .......... *G02F 1/13452* (2013.01); *G02F 1/155* (2013.01); *G02F 1/163* (2013.01); *G02F 1/29* (2013.01); *G06F 3/041* (2013.01); *G02B 27/2214* (2013.01)

(56) References Cited

U.S. PATENT DOCUMENTS

| | | | | |
|---|---|---|---|---|
| 2005/0285997 | A1* | 12/2005 | Koyama | ............ H04N 13/0454 349/117 |
| 2008/0165158 | A1* | 7/2008 | Hotelling | ................ G06F 3/044 345/174 |
| 2009/0115743 | A1* | 5/2009 | Oowaki | .................. G06F 3/044 345/174 |
| 2009/0186219 | A1* | 7/2009 | Inaba | ......................... C09J 9/02 428/354 |
| 2010/0171896 | A1* | 7/2010 | Yoshida | ................ G02F 1/1345 349/48 |
| 2011/0298750 | A1* | 12/2011 | Wang | .................... G06F 3/0412 345/174 |
| 2011/0304564 | A1* | 12/2011 | Kim | ........................ G06F 3/044 345/173 |
| 2011/0316802 | A1* | 12/2011 | Choi | ....................... G06F 3/041 345/173 |
| 2012/0235948 | A1* | 9/2012 | Inoue | .................. G02F 1/13338 345/173 |
| 2013/0229600 | A1* | 9/2013 | Takama | ............. G02B 27/2214 349/77 |
| 2014/0132859 | A1* | 5/2014 | Yanase | .................. G06F 3/0412 349/12 |

FOREIGN PATENT DOCUMENTS

| | | | | |
|---|---|---|---|---|
| CN | 103904096 | | 7/2014 | |
| CN | 103926736 | | 7/2014 | |
| CN | 104049802 | * | 9/2014 | ............ G06F 3/041 |
| CN | 104570518 | | 4/2015 | |

OTHER PUBLICATIONS

Text of the Decision of Rejection for Chinese Patent Application No. 201510064932.7 dated Oct. 30, 2017.

Office Action from China Application No. 201510064932.7 dated Dec. 23, 2016.

International Search Report and Written Opinion from PCT/CN2015/084238 dated Oct. 21, 2015.

Third Office Action for Chinese Patent Application No. 201510064932.7 dated Jun. 9, 2017.

* cited by examiner

DISPLAY APPARATUS AND MANUFACTURING METHOD THEREOF

RELATED APPLICATIONS

The present application is the U.S. national phase entry of PCT/CN2015/084238, with an international filing date of Jul. 16, 2015, which claims priority to Chinese patent application No. 201510064932.7 which was filed on Feb. 6, 2015, the entire disclosures of which are incorporated herein by reference.

FIELD OF THE INVENTION

The present invention relates to the display technical field, particularly to a display apparatus and a manufacturing method thereof.

BACKGROUND OF THE INVENTION

In recent years, with the fast development of display technology, touch control display technology, three-dimensional display technology, and electrochromic display technology are also rapidly developed. Generally, it is usually required to set a flexible printed circuit board (FPC) on an out-cell device such as a touch control device, a three-dimensional device and an electrochromic device in an existing display apparatus, which is electrically connected to a flexible printed circuit board on the display panel, to enable conduction between the out-cell device and an external signal and finally realize the normal display function of the display apparatus.

Figure 1:
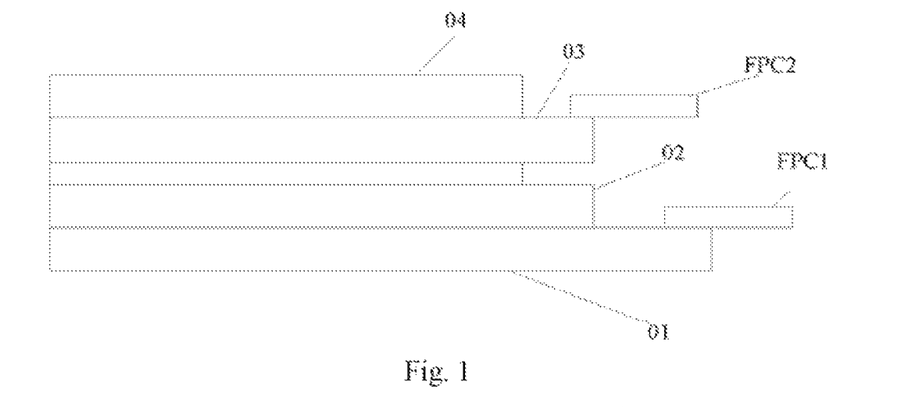
FIG. 1 is a schematic diagram of the structure of a three-dimensional liquid crystal display in the prior art.

However, in some cases, a small number of signal channels are required by the flexible printed circuit board connected to the out-cell device in the display apparatus. For example, referring to FIG. 1, a naked-eye three-dimensional liquid crystal display is taken as an example. The display panel of the display mainly comprises a first substrate 01, a second substrate 02 and a liquid crystal layer (not shown) sandwiched between the first substrate 01 and the second substrate 02. A liquid crystal barrier as the out-cell device of the display mainly comprises a third substrate 03, a fourth substrate 04 and a liquid crystal layer (not shown) sandwiched between the third substrate 03 and the fourth substrate 04. Furthermore, the display panel and the out-cell device are both provided with their respective FPCs, i.e., an FPC1 electrically connected to the first substrate 01 and an FPC2 electrically connected to the third substrate 03, as shown in FIG. 1. However, with respect to such out-cell liquid crystal barrier, in order to achieve black-white display effect, only two electrode signal channels are usually required to obtain stripes alternating between brightness and darkness, thereby realizing three-dimensional display effect. However, the display structure as shown in FIG. 1 needs to additionally make an FPC2 connected to the three-dimensional liquid crystal barrier. This would cause an increase in the cost of manufacturing the display and does not facilitate simplification of the structure of the out-cell device.

Therefore, on the premise of guaranteeing the conduction between the out-cell device in the display apparatus and the external signal, how to simplify the structure of the out-cell device and reduce the cost of manufacturing the display apparatus are problems to be solved by those skilled in the art.

SUMMARY OF THE INVENTION

The embodiments of the present invention provide a display apparatus and a manufacturing method thereof, for solving the problems existing in the prior art that the out-cell device of the display apparatus is complex in structure and high in the cost of production.

The embodiments of the present invention provide a display apparatus, comprising a display device, an out-cell device, and a flexible printed circuit board for being connected to an external signal; wherein, a binding area of the display device has a first category of leads and a second category of leads;

a binding area of the out-cell device has reserved leads, and the reserved leads are electrically connected to the second category of leads; and the flexible printed circuit board has a first category of pins and a second category of pins, the first category of leads are electrically connected to the first category of pins, and the second category of leads are electrically connected to the second category of pins.

In one possible embodiment, in the aforesaid display apparatus as provided in the embodiments of the present invention, the reserved leads are electrically connected to the second category of leads via a conductive glue.

In one possible embodiment, in the aforesaid display apparatus as provided in the embodiments of the present invention, the conductive glue is further covered with a layer of protective glue.

In one possible embodiment, in the aforesaid display apparatus as provided in the embodiments of the present invention, the conductive glue is a silver sol.

In one possible embodiment, in the aforesaid display apparatus as provided in the embodiments of the present invention, in the binding area of the display device, the first category of leads and the second category of leads are arranged in parallel, and the second category of leads are located at two sides or one side of the first category of leads.

In one possible embodiment, in the aforesaid display apparatus as provided in the embodiments of the present invention, the out-cell device is a three-dimensional device, a touch control device or an electrochromic device.

In one possible embodiment, in the aforesaid display apparatus as provided in the embodiments of the present invention, the three-dimensional device is a liquid crystal barrier, an electrochromic grating or a liquid crystal lens.

In one possible embodiment, in the aforesaid display apparatus as provided in the embodiments of the present invention, the out-cell device comprises a transparent electrode, and the transparent electrode is an interdigitated structure or a laminated structure.

The embodiments of the present invention further provide a method for manufacturing the aforesaid display apparatus, comprising:

forming, in the binding area of the display device, a first category of leads and a second category of leads;

forming, in the binding area of the out-cell device, reserved leads;

electrically connecting the reserved leads of the out-cell device to the second category of leads of the display device; and electrically connecting the first category of leads of the display device to the first category of pins of the flexible printed circuit board, and electrically connecting the second category of leads of the display device to the second category of pins of the flexible printed circuit board.

In one possible embodiment, in the aforesaid method for manufacturing the display apparatus as provided in the embodiments of the present invention, a conductive glue is used to electrically connect the reserved leads of the out-cell device to the second category of leads of the display device.

In one possible embodiment, the method for manufacturing the display apparatus as provided in the embodiments of the present invention further comprises:

after electrically connecting the reserved leads of the out-cell device to the second category of leads of the display device using a conductive glue, coating a layer of protective glue on the conductive glue.

The beneficial effects of the embodiments of the present invention are discussed as follows.

The embodiments of the present invention provide a display apparatus and a manufacturing method thereof. The display apparatus comprises a display device, an out-cell device and a flexible printed circuit board for being connected to an external signal; wherein a binding area of the display device has a first category of leads and a second category of leads; a binding area of the out-cell device has reserved leads, and the reserved leads are electrically connected to the second category of leads; and the flexible printed circuit board has a first category of pins and a second category of pins, the first category of leads are electrically connected to the first category of pins, and the second category of leads are electrically connected to the second category of pins. In this way, the reserved leads of the out-cell device are electrically connected to the second category of leads of the display device, while the second category of leads are electrically connected to the second category of pins of the flexible printed circuit board, thereby enabling conduction between the out-cell device and the external signal. As compared with the prior art in which the out-cell device and the display device are provided with their respective flexible printed circuit boards, the display apparatus as provided in the embodiments of the present invention omits the step of separately making a flexible printed circuit board of the out-cell device, thereby reducing the cost of production of the display apparatus and at the same time further simplifying the structure of the out-cell device of the display apparatus.

DETAILED DESCRIPTION OF THE INVENTION

Specific embodiments of the display apparatus and the manufacturing method thereof as provided in the embodiments of the present invention will be set forth in detail as follows in combination with the figures.

Figure 2:
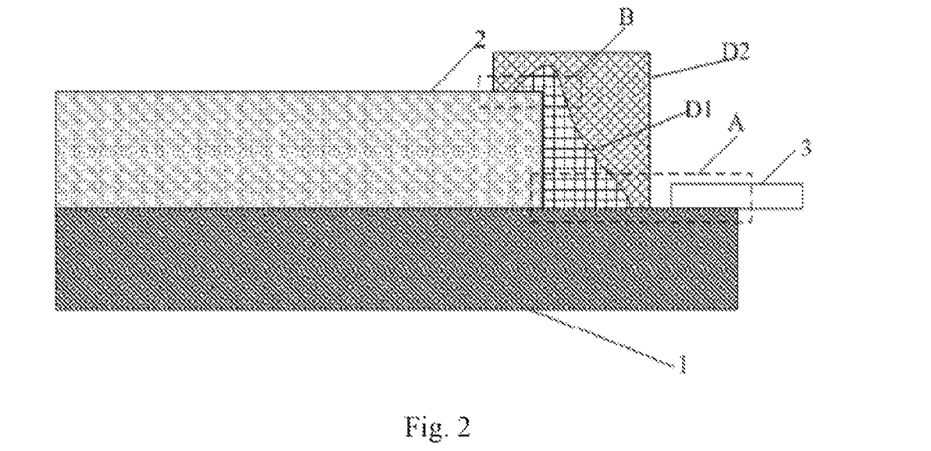
FIG. 2 is a schematic diagram of the structure of a display apparatus as provided in the embodiments of the present invention.

The embodiments of the present invention provide a display apparatus, which may specifically comprise, as shown in FIG. 2, a display device 1, an out-cell device 2 and a flexible printed circuit board 3 for being connected to an external signal; wherein, a binding area of the display device 1 has a first category of leads and a second category of leads;

a binding area of the out-cell device 2 has reserved leads, and the reserved leads are electrically connected to the second category of leads (in the embodiment as shown in FIG. 2, they are electrically connected via a conductive glue D1); and the flexible printed circuit board 3 has a first category of pins and a second category of pins, the first category of leads are electrically connected to the first category of pins, and the second category of leads are electrically connected to the second category of pins.

The aforesaid display apparatus as provided in the embodiments of the present invention comprises a display device 1, an out-cell device 2 and a flexible printed circuit board 3 for being connected to an external signal; wherein a binding area (an area marked with the dashed frame A) of the display device 1 has a first category of leads and a second category of leads (not shown); a binding area (an area marked with the dashed frame B) of the out-cell device 2 has reserved leads (not shown), and the reserved leads are electrically connected to the second category of leads (in the embodiment as shown in FIG. 2, they are electrically connected via a conductive glue D1); and the flexible printed circuit board 3 has a first category of pins and a second category of pins, the first category of leads are electrically connected to the first category of pins, and the second category of leads are electrically connected to the second category of pins. In this way, the reserved leads of the out-cell device 2 are electrically connected to the second category of leads of the display device 1 via the conductive glue, while the second category of leads are electrically connected to the second category of pins of the flexible printed circuit board 3, thereby enabling conduction between the out-cell device 2 and the external signal. As compared with the prior art in which the out-cell device and the display device are provided with their respective flexible printed circuit boards, the display apparatus as provided in the embodiments of the present invention omits the step of separately making a flexible printed circuit board of the out-cell device, thereby reducing the cost of production of the display apparatus and at the same time further simplifying the structure of the out-cell device of the display apparatus.

Figure 3A:
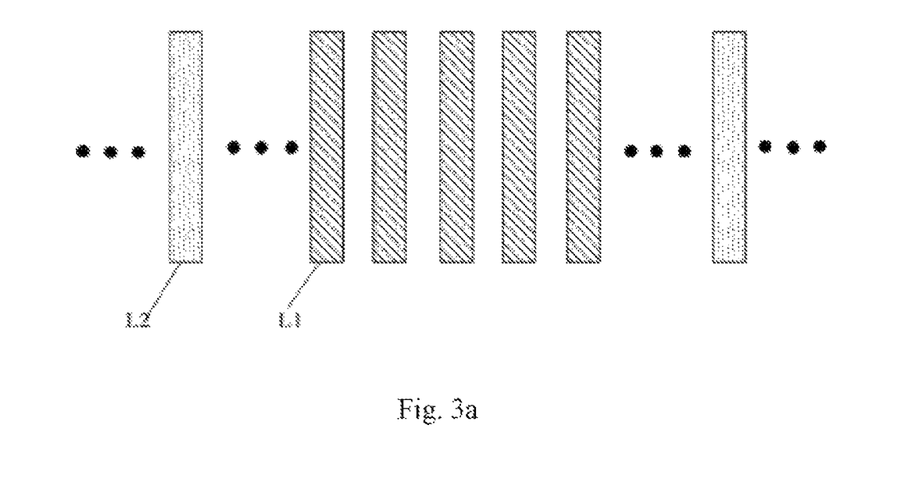
FIGS. 3a and 3b are schematic diagrams of the distribution of a first category of leads and a second category of leads as provided in the embodiments of the present invention.
Figure 3B:
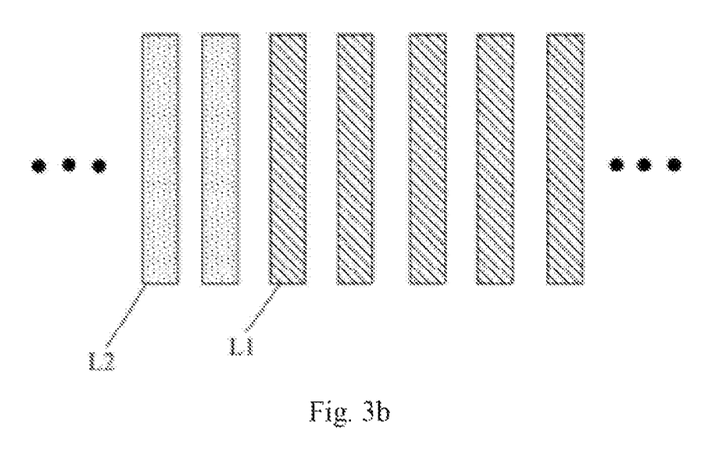

Upon implementation, in the aforesaid display apparatus as provided in the embodiments of the present invention, as shown in FIGS. 3a and 3b, in the binding area of the display device, the first category of leads L1 and the second category of leads L2 can be arranged in parallel, and the second category of leads L2 are located at two sides or one side of the first category of leads L1. Namely, it is possible to set the second category of leads L2, as shown in FIG. 3a, at two sides of the first category of leads L1. And it is also possible to set the second category of leads L2, as shown in FIG. 3b, at one side of the first category of leads L1. Specifically, the first category of leads L1 and the second category of leads L2 may also be arranged in any other suitable manner, which is not defined here. In this way, by arranging the first category of leads L1 and the second category of leads L2 in parallel and setting the second category of leads L2 at two sides or one side of the first category of leads L1, it is advantageous to differentiation between these two categories of leads and to facilitate coating of the conductive glue. Namely, when coating the conductive glue on the second category of leads L2, it is easy to find the positions of the second category of leads L2, and this facilitates coating of the conductive glue.

Upon implementation, in the aforesaid display apparatus as provided in the embodiments of the present invention, in order to prevent the conductive glue from falling off by accident during the subsequent processes of manufacturing the display apparatus to thereby affect conduction between the out-cell device and the external signal, the conductive glue D1 is generally further covered with a layer of protective glue D2, as shown in FIG. 2. In this way, covering a layer of protective glue D2 on the conductive glue D1 can prevent the conductive glue D1 from falling off by accident due to direct contact during the processes of manufacturing the display apparatus, thereby ensuring the electrical connection between the reserved leads of the out-cell device and the second category of leads of the display device and thus ensuring conduction between the out-cell device and the external signal.

Upon implementation, in the aforesaid display apparatus as provided in the embodiments of the present invention, in order to achieve conduction between the out-cell device and the external signal, it is required to electrically connect the reserved leads of the out-cell device and the second category of leads of the display device. However, there may be a plurality of measures for implementing such an electrical connection, which are not defined here. In one implementation as provided in the embodiments of the present invention, the reserved leads of the out-cell device are electrically connected to the second category of leads of the display panel by virtue of the conductive glue coating technology. However, it is noted that the conductive glue is one kind of metal adhesives capable of realizing the conductive glue coating technology, but the scope of the present invention is not limited to this. Preferably, the conductive glue may be a silver sol, because the silver sol has good conductivity and facilitates signal transmission between leads.

Upon implementation, in the aforesaid display apparatus as provided in the embodiments of the present invention, the out-cell device may be a three-dimensional device, a touch control device or an electrochromic device. Reserved leads can be set for different types of out-cell devices. However, conduction between the out-cell device and the external signal can be realized by electrically connecting the reserved leads of the out-cell device to the second category of leads of the display device via the conductive glue. As compared with the prior art in which the out-cell device and the display device are provided with their respective flexible printed circuit boards, the display apparatus as provided in the embodiments of the present invention omits the step of separately making a flexible printed circuit board of the out-cell device, thereby reducing the cost of production of the display apparatus and at the same time further simplifying the structure of the out-cell device of the display apparatus.

Upon implementation, the aforesaid display apparatus as provided in the embodiments of the present invention may be a three-dimensional display, and the corresponding three-dimensional devices may be a liquid crystal barrier (LC barrier), an electrochromic grating or a liquid crystal lens (LC lens). The aforesaid display apparatus as provided in the embodiments of the present invention may also be applied in any product or component having a display function, such as mobile phone, tablet computer, television, display, notebook computer, digital frame, navigator, and so on. Namely, it can be applied in various display products based on practical needs, which is not defined here.

Figure 4A:
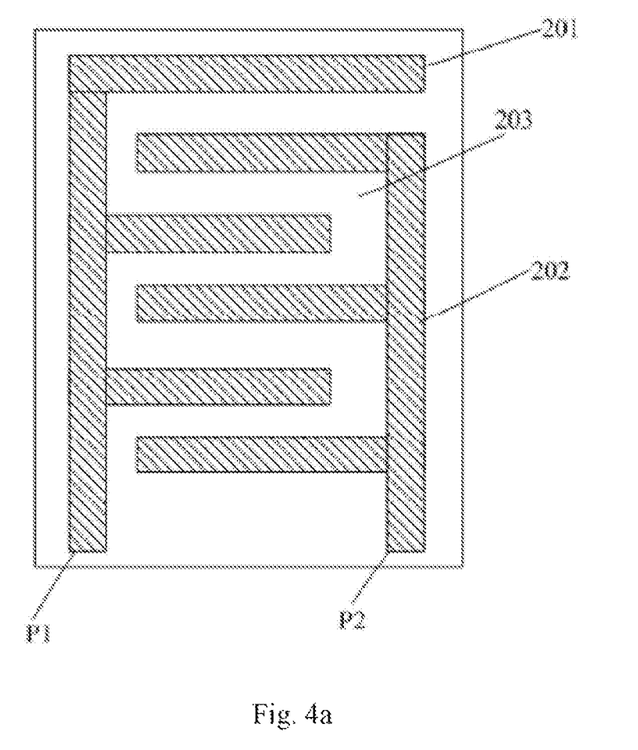
FIGS. 4a to 4c are schematic diagrams of the structures of an electrochromic grating as provided in the embodiments of the present invention.

Upon implementation, in the aforesaid display apparatus as provided in the embodiments of the present invention, the out-cell device comprises a transparent electrode, which may be an interdigitated structure or a laminated structure. Specifically, an electrochromic grating as the out-cell device will be illustrated as an example as follows. As shown in FIG. 4a, the electrochromic grating comprises two transparent comb-like electrodes 201 and 202 that form an interdigitated structure, and an electrochromic material 203 filled in gaps between the two comb-like electrodes. Specifically, two ends P1 and P2 of the two separate comb-like electrodes may serve as reserved lead terminals of the out-cell device. Conduction between the out-cell device and the external signal can be realized by electrically connecting the reserved lead terminals to the second category of leads of the display device via the conductive glue. An electric field is formed between the comb-like electrodes by applying positive and negative voltage signals to the two ends P1 and P2 of the two separate comb-like electrodes, such that the electrochromic material filled in gaps between the two comb-like electrodes can change its color under the effect of the electric field, thereby enabling display of different colors and finally achieving the normal display function of the electrochromic grating.

Figure 4B:
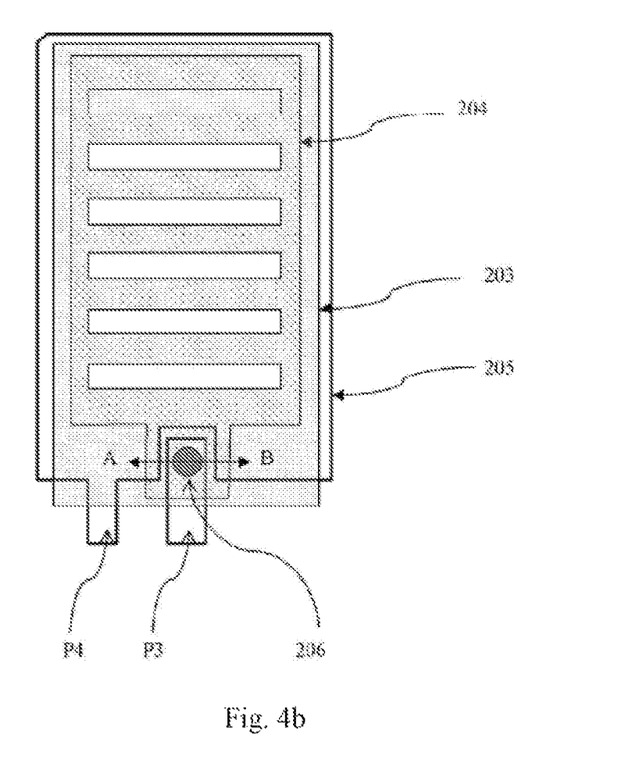
Figure 4C:
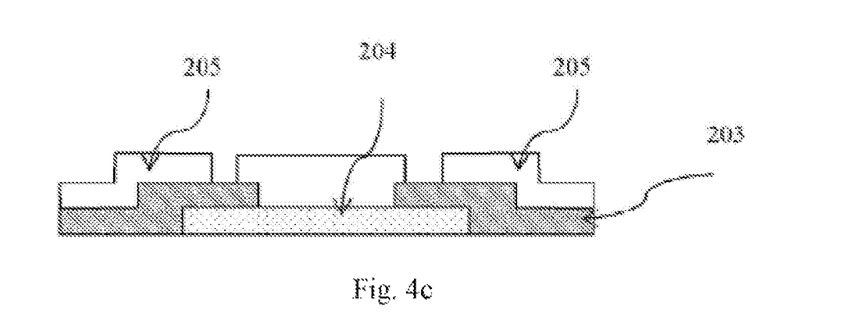

Specifically, the electrochromic grating may also be the laminated structure as shown in FIG. 4b, wherein the electrochromic grating comprises a first transparent electrode 204 and a second transparent electrode 205, and an electrochromic material 203 filled between the two transparent electrodes. Two ends P3 and P4 of the two separate transparent electrodes may serve as reserved lead ends of the out-cell device. Electrically connecting the reserved lead ends to the second category of leads of the display device via a conductive glue can enable conduction between the out-cell device and the external signal. An electric field is formed between the two transparent electrodes by applying positive and negative voltage signals to the two ends P3 and P4 of the two separate transparent electrodes, such that the electrochromic material filled between the two transparent electrodes can change its color under the effect of the electric field, thereby realizing display of different colors and finally achieving the normal display function of the electrochromic grating. In addition, in the transparent electrodes of a laminated structure, different from the transparent electrodes of an interdigitated structure, it is required to form a through hole 206 on the electrochromic material 203 between the two transparent electrodes in order to enable conduction between the reserved lead end P3 of the first transparent electrode 204 and the first transparent electrode 204. FIG. 4c shows a cross-sectional diagram of the transparent electrode layers of a laminated structure along the cut direction AB as shown in FIG. 4b.

Figure 5:
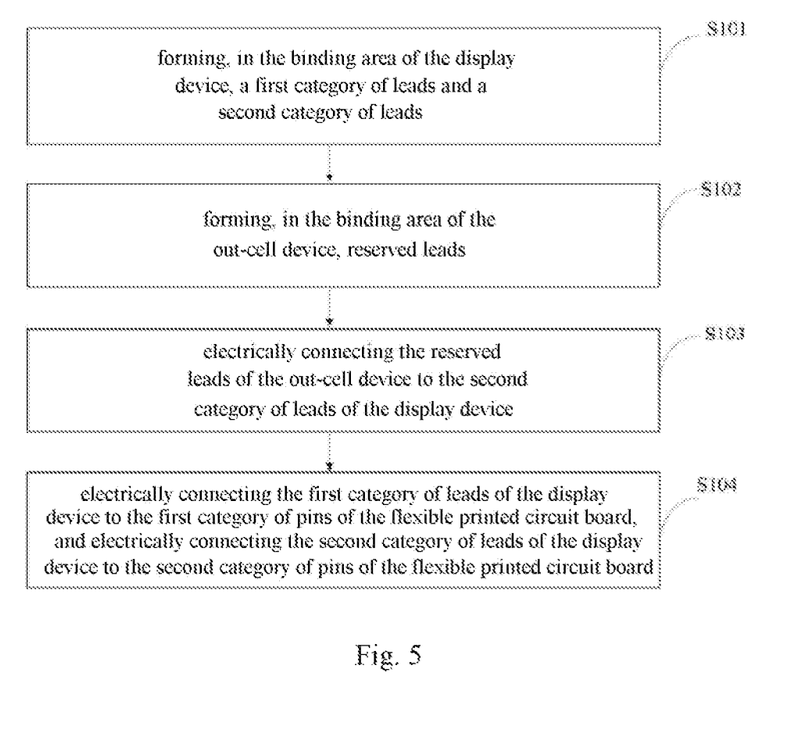
FIG. 5 is a flow chart of a method for manufacturing a display apparatus as provided in the embodiments of the present invention.

The embodiments of the present invention provide a method for manufacturing the aforesaid display apparatus. As shown in FIG. 5, the method may specifically comprise the steps of:

S101 forming, in the binding area of the display device, a first category of leads and a second category of leads;

S102 forming, in the binding area of the out-cell device, reserved leads; S103 electrically connecting the reserved leads of the out-cell device to the second category of leads of the display device; and S104 electrically connecting the first category of leads of the display device to the first category of pins of the flexible printed circuit board, and electrically connecting the second category of leads of the display device to the second category of pins of the flexible printed circuit board.

Upon implementation, in the method for manufacturing the display apparatus as provided in the embodiments of the present invention, the reserved leads of the out-cell device can be electrically connected to the second category of leads of the display device via a conductive glue.

In the method for manufacturing the display apparatus as provided in the embodiments of the present invention, a first category of leads and a second category of leads are set in the binding area of the display device; reserved leads are set in the binding area of the out-cell device; the reserved leads of the out-cell device are electrically connected to the second category of leads of the display device (in specific embodiments, the electrical connection can be realized using a conductive glue); the first category of leads of the display device are electrically connected to the first category of pins of the flexible printed circuit board; and the second category of leads of the display device are electrically connected to the second category of pins of the flexible printed circuit board. In this way, the reserved leads of the out-cell device are electrically connected to the second category of leads of the display device via the conductive glue, while the second category of leads are electrically connected to the second category of pins of the flexible printed circuit board, thereby realizing conduction between the out-cell device and the external signal. As compared with the prior art in which the out-cell device and the display device are provided with their respective flexible printed circuit boards, the display apparatus as provided in the embodiments of the present invention omits the step of separately making a flexible printed circuit board of the out-cell device, thereby reducing the cost of production of the display apparatus and at the same time further simplifying the structure of the out-cell device of the display apparatus.

Upon implementation, in the method for manufacturing the display apparatus as provided in the embodiments of the present invention, in order to prevent the conductive glue from falling off by accident during the subsequent processes of manufacturing the display apparatus to thereby affect conduction between the out-cell device and the external signal, it may further comprise the step of: coating a layer of protective glue on the conductive glue after electrically connecting the reserved leads of the out-cell device to the second category of leads of the display device using the conductive glue. In this way, covering a layer of protective glue on the conductive glue can prevent the conductive glue from falling off by accident due to direct contact during the processes of manufacturing the display apparatus, thereby ensuring the electrical connection between the reserved leads of the out-cell device and the second category of leads of the display device and thus ensuring conduction between the out-cell device and the external signal.

The embodiments of the present invention provide a display apparatus and a manufacturing method thereof. The display apparatus comprises a display device, an out-cell device and a flexible printed circuit board for being connected to an external signal; wherein a binding area of the display device has a first category of leads and a second category of leads; a binding area of the out-cell device has reserved leads, and the reserved leads are electrically connected to the second category of leads; and the flexible printed circuit board has a first category of pins and a second category of pins, the first category of leads are electrically connected to the first category of pins, and the second category of leads are electrically connected to the second category of pins. In this way, the reserved leads of the out-cell device are electrically connected to the second category of leads of the display device, while the second category of leads are electrically connected to the second category of pins of the flexible printed circuit board, thereby enabling conduction between the out-cell device and the external signal. As compared with the prior art in which the out-cell device and the display device are provided with their respective flexible printed circuit boards, the display apparatus as provided in the embodiments of the present invention omits the step of separately making a flexible printed circuit board of the out-cell device, thereby reducing the cost of production of the display apparatus and at the same time further simplifying the structure of the out-cell device of the display apparatus.

Obviously, those skilled in the art can make modifications and variations to the present invention without departing from the spirit and scope thereof. In this way, if these modifications and variations to the present invention pertain to the scopes of the claims of the present invention and equivalent techniques thereof, the present invention also intends to include these modifications and variations.

The invention claimed is:

1. A display apparatus comprising:
   a display device;
   an out-cell device;
   a flexible printed circuit board for being connected to an external signal;
   wherein a binding area of the display device has a first category of leads and a second category of leads;
   wherein a binding area of the out-cell device has reserved leads, the reserved leads being electrically connected to the second category of leads;
   wherein the flexible printed circuit board has a first category of pins and a second category of pins, the first category of leads being electrically connected to the first category of pins, and the second category of leads being electrically connected to the second category of pins; and
   wherein the out-cell device is an electrochromic device.

2. The display apparatus according to claim 1, wherein the reserved leads are electrically connected to the second category of leads via a conductive glue.

3. The display apparatus according to claim 2, wherein the conductive glue is further covered with a layer of protective glue.

4. The display apparatus according to claim 2, wherein the conductive glue is a silver colloid.

5. The display apparatus according to claim 1, wherein in the binding area of the display device, the first category of leads and the second category of leads are arranged in parallel, and the second category of leads are located at two sides or one side of the first category of leads.

6. The display apparatus according to claim 1, wherein the three-dimensional device is a liquid crystal barrier, an electrochromic grating or a liquid crystal lens.

7. The display apparatus according to claim 1, wherein the out-cell device comprises a transparent electrode, the transparent electrode being an interdigitated structure or a laminated structure.

8. A method for manufacturing the display apparatus according to claim 1, comprising:
   forming, in the binding area of the display device, a first category of leads and a second category of leads;
   forming, in the binding area of the out-cell device, reserved leads;
   electrically connecting the reserved leads of the out-cell device to the second category of leads of the display device; and electrically connecting the first category of leads of the display device to the first category of pins of the flexible printed circuit board, and electrically connecting the second category of leads of the display device to the second category of pins of the flexible printed circuit board.

9. The method according to claim 8, wherein the step of electrically connecting the reserved leads of the out-cell device to the second category of leads of the display device comprises electrically connecting the reserved leads to the second category of leads via a conductive glue.

10. The method according to claim 9, further comprising after electrically connecting the reserved leads to the second category of leads via a conductive glue, covering the conductive glue with a layer of protective glue.

11. The method according to claim 9, wherein the conductive glue is a silver colloid.

12. The method according to claim 8, wherein in the binding area of the display device, the first category of leads and the second category of leads are arranged in parallel, and the second category of leads are located at two sides or one side of the first category of leads.

13. The method according to claim 8, wherein the out-cell device is a three-dimensional device, a touch control device or an electrochromic device.

14. The method according to claim 13, wherein the three-dimensional device is a liquid crystal barrier, an electrochromic grating or a liquid crystal lens.

15. The method according to claim 8, wherein the out-cell device comprises a transparent electrode, the transparent electrode being an interdigitated structure or a laminated structure.

16. The method according to claim 8, wherein a conductive glue is used to electrically connect the reserved leads of the out-cell device to the second category of leads of the display device.

17. The method according to claim 16, further comprising:
    after electrically connecting the reserved leads of the out-cell device to the second category of leads of the display device using a conductive glue, coating a layer of protective glue on the conductive glue.

* * * * *